United States Patent
Smooha

[11] Patent Number: 5,969,421
[45] Date of Patent: Oct. 19, 1999

[54] INTEGRATED CIRCUIT CONDUCTORS THAT AVOID CURRENT CROWDING

[75] Inventor: Yehuda Smooha, South Whitehall Township, Lehigh County, Pa.

[73] Assignee: Lucent Technologies Inc., Murray Hill, N.J.

[21] Appl. No.: 08/972,904

[22] Filed: Nov. 18, 1997

[51] Int. Cl.⁶ .............................. H01L 23/48; H05K 1/14; H05K 1/05

[52] U.S. Cl. .......................... 257/758; 257/700; 257/701; 257/774; 257/786; 257/921

[58] Field of Search ..................... 257/758, 701, 257/700, 774, 773, 786, 784, 621

[56] References Cited

U.S. PATENT DOCUMENTS

| | | | |
|---|---|---|---|
| 5,034,799 | 7/1991 | Tomita et al. | 257/758 |
| 5,117,276 | 5/1992 | Thomas et al. | 257/758 |
| 5,475,264 | 12/1995 | Sudo et al. | 257/758 |
| 5,623,160 | 4/1997 | Liberkowski | 257/758 |
| 5,631,478 | 5/1997 | Okumura | 257/758 |
| 5,710,462 | 1/1998 | Mizushima | 257/758 |
| 5,739,587 | 4/1998 | Sato | 257/774 |
| 5,757,072 | 5/1998 | Gorowitz et al. | 257/758 |
| 5,834,845 | 11/1998 | Stolmeijer | 257/758 |
| 5,847,466 | 12/1998 | Ito et al. | 257/774 |

*Primary Examiner*—Alexander Oscor Williams
*Attorney, Agent, or Firm*—James H. Fox

[57] ABSTRACT

An integrated circuit and method of use provides conductive vias between conductor layers so that current flows in such a manner that current crowding is reduced in at least one underlying layer. In particular, the current flows from an overlying conductor (306) down to an underlying conductor (303) by a first set of vias (307), and a portion flows through the underlying conductor towards the destination (e.g., a bondpad). Another portion of the current flows downward to a still lower conductor by means of a second set of vias (310, 311). The second set of vias is located further away from the destination than the first set of vias. Current crowding in the underlying conductor is thereby reduced. An integrated circuit utilizing the inventive technique typically has transistors formed in the semiconductor substrate, wherein at least one of the electrodes (e.g., gate, source or drain in the case of field effect transistors) connects to one or more of the illustrated conductors by means of a "window" opening in an intervening dielectric layer. However, other types of devices, including for example optical, magnetic, ferroelectric, capacitive, and/or inductive devices, may be formed in the substrate and contacted by the overlying conductors.

9 Claims, 3 Drawing Sheets

5,969,421

INTEGRATED CIRCUIT CONDUCTORS THAT AVOID CURRENT CROWDING

BACKGROUND OF THE INVENTION

1. Field of the Invention

The present invention relates to an integrated circuit having conductors that avoid current crowding, and a method of use.

2. Description of Prior Art

BRIEF DESCRIPTION OF THE DRAWINGS

Integrated circuits (ICs) are becoming ever-increasingly more dense, with minimum linewidths currently around 0.25 micrometers (microns), and expected to shrink down to 0.1 microns and below. This means that design techniques must take into account various factors related to these very small dimensions. In particular, the density of electrical current flowing though conductors becomes ever more important, since the current density relates to the failure rate of the IC. In fact, when the current density exceeds a given limit related to the size, geometry, and material composition of the conductors, the failure rate often rises very rapidly. Therefore, design techniques have been established to avoid high currents in all portions of the conductors on a given IC. In some situations, a "current crowding" effect can take place, wherein a high current density is generated in a relatively localized area. For example, current crowding may occur when two conductors interconnect through an intervening dielectric layer by means of openings referred to as "vias", since the vias are typically sized as small as possible in order to save space on the integrated circuit. Therefore, special design consideration is typically given to vias so as to not exceed a given current density in operation, while still minimizing the space requirements.

In the configuration shown in FIG. 1, the I/O bus II (104) is connected to the bondpad (100) by means of the underlying metal layers (e.g., "metal one", "metal two", and "metal three"). The use of the underlying layers provides for the desired connection while avoiding an undesired connection to the intervening I/O bus I (103). In addition, the use of the multiple metal layers provides for an increased current-carrying capacity, which is significant since the underlying metal layers are typically not as thick as the top metal layer. In order to provide the desire connections to the various metal layers, sets of "vias" are provided. For example, the vias 105 and 106 connect the top level metal (metal four) to the next underlying metal layer (metal three). Similarly, vias 107 and 108 connect the metal three layer to the metal two layer, and vias 109 and 110 connect the metal two layer to the metal one layer.

Figure 1:
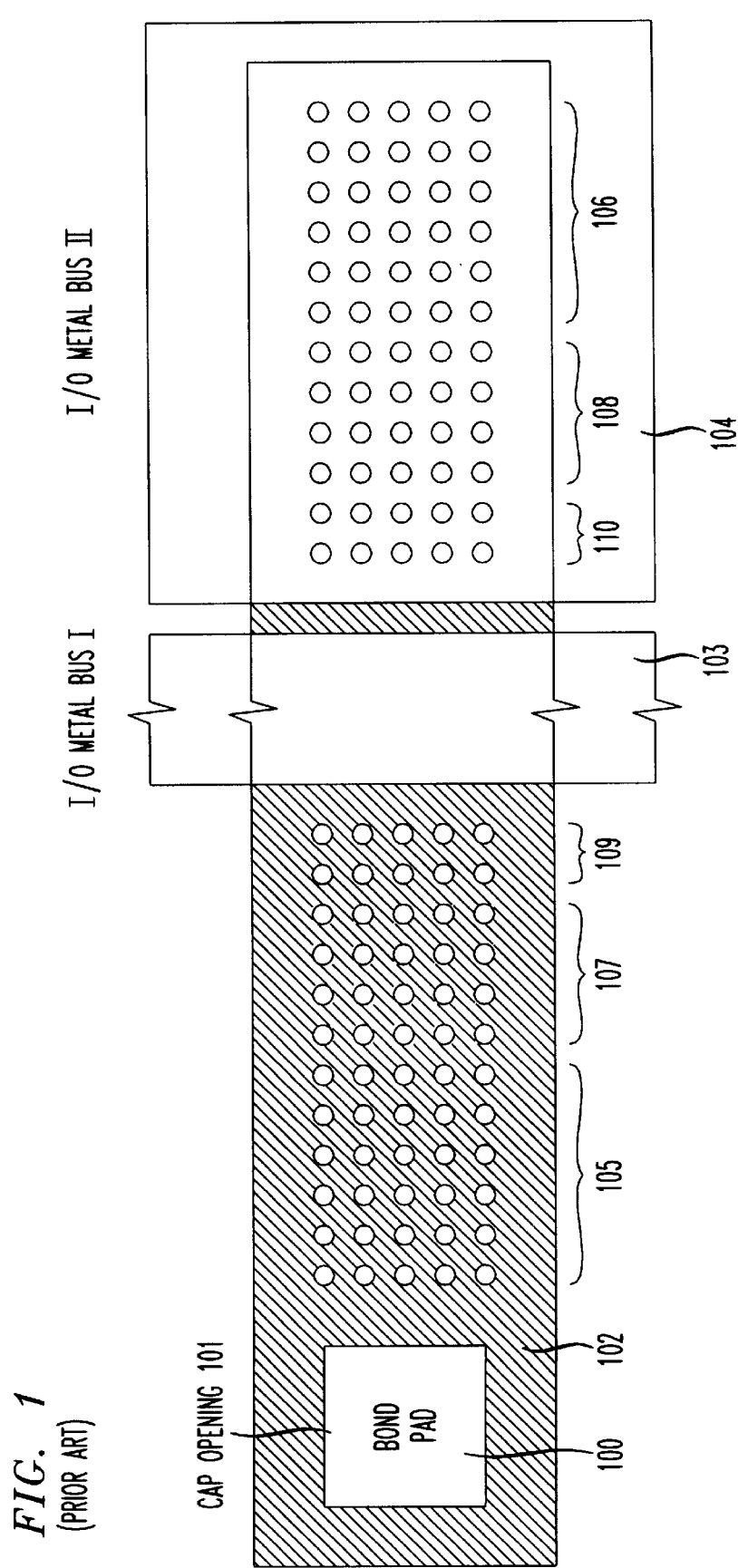
Referring to FIG. 1, a top view of a typical conductor layout in an illustrative four-level metal technology is shown. The bondpad 100 is formed in the top-level of metal, referred to as "metal four" in the illustrative four-layer case. The top level metal is typically the thickest metal layer, and hence most capable of carrying the greatest amount of current. The bondpad 100 is exposed for connection by wirebonding or other techniques (e.g., solder bumps) by an opening 101 in the overlying dielectric layer 102. The dielectric typically comprises silicon dioxide or silicon nitride as a "cap" layer, and the opening is usually referred to as a "caps" opening. In addition, the I/O (input/output) bus I (103) and I/O bus II (104) are also formed in metal four.
Figure 2:
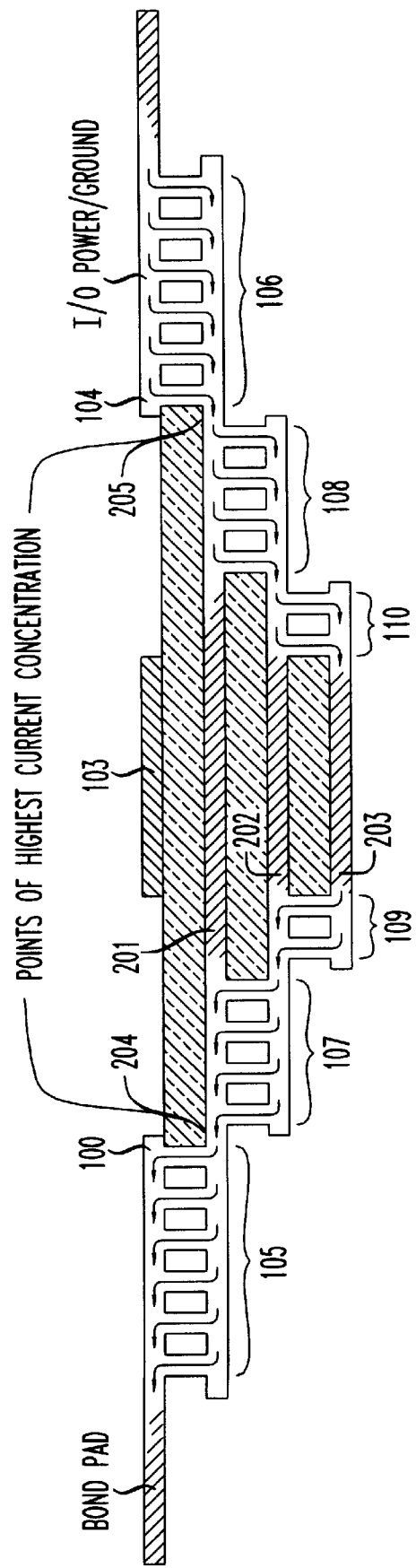
Referring to FIG. 2, a cross-section view of this embodiment is shown, with the bondpad 100, I/O bus 103 and I/O bus 104 illustrated as being formed in the top level metal layer. The underlying metal layer three (201), metal layer two (202), and metal layer one (203) are also shown, as well as the sets of vias 105 to 110.

The flow of current through the vias is shown by the arrows, being a flow in the direction from the I/O bus towards the bondpad in the illustrative case. Note in particular that the regions of highest current concentration are shown as regions 204 and 205 that are located in the metal three layer 201. These "hot spots" result from the fact that all of the current from the I/O bus (104) to the bond pad (100) must flow through these regions in the prior-art design. However, it is not apparent that workers in the art understood that these were in fact hot spots, and hence regions of increased likelihood of electromigration failure. Rather, the custom of spreading out the current flow among the underlying metal layers was thought to be sufficient to avoid current crowding, and hence avoid premature failure. Furthermore, because of the fine pitch required for bond pad placement, increasing the metal 3 width is not a viable solution to the current crowding.

SUMMARY OF THE INVENTION

I have invented an integrated circuit and method of use wherein vias are provided between conductor layers in a pattern so that current flows in such a manner as to reduce current crowding in at least one conductor layer. In particular, the current flows from an overlying conductor down to an underlying conductor by a first set of vias, and a portion flows through the underlying conductor towards the destination (e.g., a bondpad). Another portion of the current flows downward to a still lower conductor by means of a second set of vias. At least some of the vias in the second set are located further away from the destination than the vias in the first set nearest the destination of current flow.

DETAILED DESCRIPTION

Figure 3:
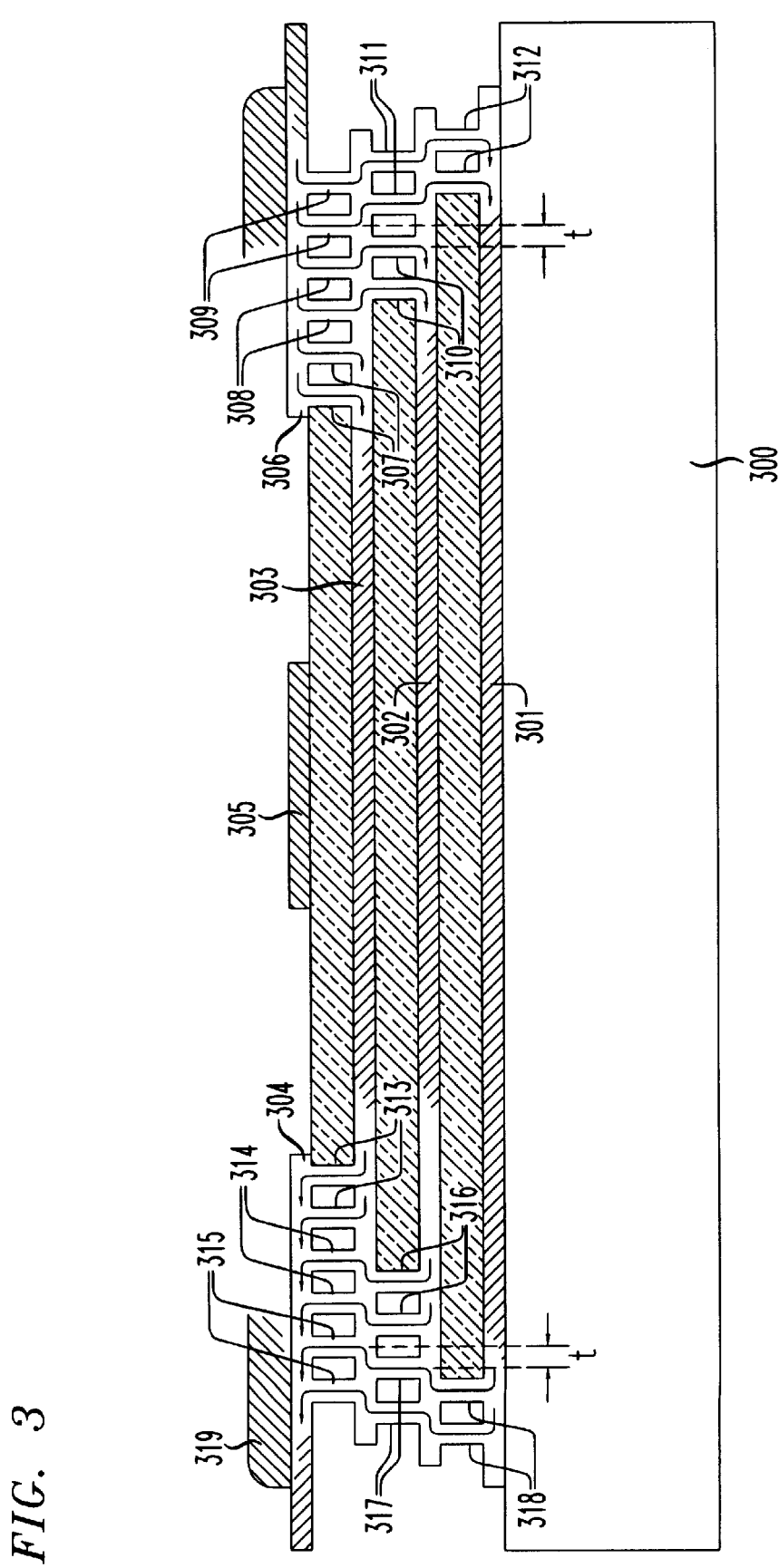

The following detailed description relates to an integrated circuit having vias provided in such a manner as to reduce current crowding, and a method of use therefore. Referring to FIG. 3, a first embodiment of the inventive technique is illustrated. An integrated circuit semiconductor substrate 300 has formed thereon conductors 301, 302, 303, 304, 305 and 306, being formed from the metal layers one (nearest the substrate) to four (top as viewed). These layers are separated from each other, and from the semiconductor substrate, by dielectric layers (not shown), which typically comprise silicon dioxide. The bondpad (not shown) is located to the left of the caps layer 319. It can be seen that the current flow from the IO bus I conductor (306) in the metal four layer down to the conductor 303 in the metal three layer is accomplished by means of vias 307, 308 and 309, which are illustratively grouped in pairs. Similarly, the current flows from conductor 303 to conductor 302 by means of vias 310 and 311, and from conductor 302 to 301 by means of vias 312. Note that the vias 310 and 311 are offset to the right (i.e., away from the bondpad) with respect to the vias 308 and 309. Therefore, a portion of the current flows initially toward the right of vias 308 and 309 in conductor 302. Thereafter, the current flows to the left (i.e., toward the bondpad) from vias 310 in conductor 302. Similarly, the vias 312 are offset to the right of the vias 311, so that a portion of the current flows initially toward the right of vias 311 in conductor 302. Thereafter, the current portion flows to the left of vias 312 in conductor 301. It can be seen that by directing a portion of the current away from the destination (e.g., the bondpad in this case), that the current flow is divided so that the current crowding is significantly reduced in conductor 303. Current crowding in conductor 302 is avoided in a similar manner.

On the left-hand side of FIG. 3, it can be seen that the current flows up toward the bondpad by means of the vias 313 to 318, which are offset in a corresponding manner. Therefore, the total current flow reaches the bondpad through top-level conductor 303 in a manner that avoids current crowding in the underlying conductors. The vias are offset by a distance "t" as shown in FIG. 3. In a typical embodiment, this distance is the minimum lithographic distance, being typically less than 1 micrometer and more typically 0.35 micrometers or less in present-day embodiments. It is usually desirable to use the minimum lithographic distance in order to conserve space on the integrated circuit. However, an offset distance greater than the minimum may be used if desired. It can be seen that while the above illustrative embodiment has been given in terms of four metal layers, use with any number of layers greater than two (i.e., three or more) is possible. Furthermore, while the conductor layers and vias are typically metal, it is possible to practice the present invention with other conductors; for example, doped polysilicon, metal silicide, and metal nitride conductors.

Although the layout technique described above is advantageous for reducing current crowding in layer 303, it is not necessary to shift the contacts 310 and 311 to the right of 308 and 309 as shown in FIG. 3. Rather, they may be shifted to the left. In either case, it can be seen that as a group, the vias 310 and 311 are located to the right (i.e., away from the destination of the current flow) of the via (307) that is nearest the destination of current flow. Hence, this location of the underlying vias produces the desirable result of diverting the current down toward the bottom layer (301) before it can produce current crowding in the lateral direction of current flow in at least one of the underlying layers (e.g., layer 303). A similar placement of the vias 312 toward the right of the left-most via 310 provides for a downward direction of current flow before current crowding occurs in the conductor 302. However, it is not necessary for all of the vias in an underlying group to be located to the right of the left-most via in the overlying group in order for beneficial effects to be obtained in reducing current crowding. For example, for layout reasons that minimize space requirements, it may be desirable to allow some of the vias in an underlying layer to be located nearer to the destination of current flow than those in the overlying layer. However, at least some of the vias in the underlying layer are located further from the destination of current flow than the vias in the overlying layer that are nearest to the destination of current flow. Depending on the number of underlying metal layers, I recommend that at least half of the vias in an underlying group (e.g., 310, 311) be located to the right (i.e., away from the destination of current flow) of the vias (e.g., 307) in the overlying layer that are nearest to the destination of current flow.

An integrated circuit utilizing the inventive technique typically has transistors formed in the semiconductor substrate, wherein at least one of the electrodes (e.g., gate, source or drain in the case of field effect transistors) connects to one or more of the illustrated conductors by means of a "window" opening in an intervening dielectric layer. However, other types of devices, including for example optical, magnetic, ferroelectric, capacitive, and/or inductive devices, may be formed in the substrate and contacted by the overlying conductors. While the top conductor is typically used for conducting the total current from the source to the destination, and the underlying layers used for carrying a portion of the current, it can be seen that other configurations may be used if desired. Also, while the vias between given conductive levels are typically the same size, that is not necessarily the case. For example, the vias 308 could be larger than the vias 307, allowing for more current to flow through the vias 308. In that case, the vias 309 could be eliminated entirely if desired. However, for the most even distribution of current flow, I recommend the same sizes vias between adjacent conductor levels. Finally, note that the present invention may, if desired, be practiced on only one end of the conductors. For example, the bondpad could be constructed by overlaying all metal levels in the bond pad area and opening big contact windows between all the layers. In that case, the benefits of the inventive technique would be obtained on the source end of the conductors.

I claim:

1. An integrated circuit comprising a substrate overlaid by conductive levels and having conductors formed in at least three conductive levels for carrying current from a source towards a destination, characterized in that a first conductor (306) contacts an underlying second conductor (303) by a first set of vias (307, 308, 309) so that a first portion of the current flows towards the destination in said second conductor; and the second conductor contacts an underlying third conductor (302) by a second set of vias (310) that is laterally offset with respect to said first set of vias; and wherein at least some of the vias in said second set are located further from said destination than the vias in said first set that are nearest to said destination.

2. The invention of claim 1 further characterized in that said second conductor contacts said third conductor (302) by a third set of vias (311) that is laterially offset with respect to said second set of vias, and said third conductor (302) contacts an underlying fourth conductor (301) by a fourth set of vias (312) that is laterally offset with respect to said third set of vias, and wherein at least some of the vias in said fourth set are located further from said destination than the vias in said third set that are nearest to said destination.

3. The invention of claim 1 further characterized in that the lateral offset between the vias in said first set and said second set is the minimum lithographic dimension used to form said integrated circuit.

4. The invention of claim 1 further characterized in that the lateral offset between vias in said first set and said second set of vias is less than 1 micrometers.

5. The invention of claim 1 further characterized in that said conductive levels are metal.

6. An integrated circuit comprising a substrate overlaid by metal levels and having conductors formed in at least three metal levels for carrying current from a source towards a destination, characterized in that a first conductor (306) contacts an underlying second conductor (303) by a first set of vias (307, 308, 309) so that a first portion of the current flows towards the destination in said second conductor, and said second conductor contacts an underlying third conductor (302) by a second set of vias (310, 311), and said third conductor contacts an underlying fourth conductor (301) by a third set of vias (312);

wherein the vias in said second set are laterally offset from the vias in said first set, and the vias in said third set are laterally offset from the vias in said second set, and wherein at least some of the vias in said second set are located further from said destination than the vias in said first set that are nearest to said destination, and at least some of the vias in said third set are located further from said destination that the vias in said second set that are nearest to said destination, and still further characterized in that the lateral offset between the sets of vias is the minimum lithographic dimension used to form said integrated circuit.

7. A method of operating an integrated circuit that comprises a substrate overlaid by conductive levels and having conductors formed in at least three conductive levels, by steps comprising causing a flow of current from a source towards a destination, characterized in that a first conductor (306) contacts an underlying second conductor (303) by a first set of vias (307, 308, 309) so that a portion of the current flows towards the destination in said second conductor;

and the second conductor contacts an underlying third conductor (302) by a second set of vias (310, 311) that is laterally offset with respect to said second set of vias, and wherein at least some of the vias in said second set are located further from said destination than the vias in said first set that are nearest to said destination.

8. The invention of claim 7 further characterized in that said third conductor contacts an underlying fourth conductor (301) by a third set of vias (312) that is laterally offset with respect to said second set of vias, and at least some of the vias in said third set are located further from said destination that the vias in said second set that are nearest to said destination.

9. The invention of claim 7 further characterized in that the lateral offset between the vias in the sets is the minimum lithographic dimension used to form said integrated circuit.

* * * * *